United States Patent
Lee (10) Patent No.: US 10,069,513 B2
(45) Date of Patent: Sep. 4, 2018

(54) HIGH-SPEED SERIAL DATA RECEIVING APPARATUS

(71) Applicant: Hanwha Techwin Co., Ltd., Changwon-si (KR)

(72) Inventor: Young Su Lee, Changwon-si (KR)

(73) Assignee: Hanwha Techwin Co., Ltd., Changwon-si (KR)

( * ) Notice: Subject to any disclaimer, the term of this patent is extended or adjusted under 35 U.S.C. 154(b) by 0 days.

(21) Appl. No.: 15/550,059

(22) PCT Filed: Feb. 12, 2015

(86) PCT No.: PCT/KR2015/001408
§ 371 (c)(1),
(2) Date: Aug. 10, 2017

(87) PCT Pub. No.: WO2016/129718
PCT Pub. Date: Aug. 18, 2016

(65) Prior Publication Data
US 2018/0026657 A1  Jan. 25, 2018

(30) Foreign Application Priority Data
Feb. 10, 2015 (KR) ........................ 10-2015-0020292

(51) Int. Cl.
*H03M 9/00* (2006.01)
*H03K 5/135* (2006.01)

(52) U.S. Cl.
CPC .............. *H03M 9/00* (2013.01); *H03K 5/135* (2013.01)

(58) Field of Classification Search
CPC ........... H03M 9/00; H03K 5/135; H04L 7/042
USPC ......... 341/100–101; 375/371, 354–357, 360, 375/362, 363, 365, 366, 368, 376
See application file for complete search history.

(56) References Cited

U.S. PATENT DOCUMENTS

| | | | |
|---|---|---|---|
| 8,045,667 B2 * | 10/2011 | Lim ...................... | H03K 5/135 375/354 |
| 2007/0050658 A1 | 3/2007 | Kuwata | |
| 2008/0101238 A1 | 5/2008 | Dietrich et al. | |
| 2008/0229273 A1 | 9/2008 | Lorusso et al. | |

(Continued)

FOREIGN PATENT DOCUMENTS

| KR | 10-2008-0078608 A | 8/2008 |
|---|---|---|
| KR | 10-1470989 B1 | 12/2014 |

OTHER PUBLICATIONS

Communication dated Nov. 6, 2015 issued by the International Searching Authority in counterpart International Application PCT/KR2015/001408 (PCT/ISA/220/210/237).

*Primary Examiner* — Khai M Nguyen
(74) *Attorney, Agent, or Firm* — Sughrue Mion, PLLC (57) ABSTRACT

Provided is a high-speed serial data receiving apparatus including: a clock converter configured to convert a serial clock into a parallel clock; a data converter configured to convert a serial data packet into N parallel data packets and outputting the N parallel data packets; a synchronization signal detector configured to receive the N parallel data packets and the parallel clock, and detecting a data start synchronization of the N parallel data packets output from the data converter by comparing the parallel data packets with a synchronization code of N bits set in advance; and an error compensation unit configured to detect and compensate for a skew between parallel clock and data.

16 Claims, 7 Drawing Sheets

(56) References Cited

U.S. PATENT DOCUMENTS

2010/0103929 A1 4/2010 Lee et al.
2013/0021059 A1 1/2013 Singh et al.
2013/0249612 A1 9/2013 Zerbe et al.

\* cited by examiner

HIGH-SPEED SERIAL DATA RECEIVING APPARATUS

TECHNICAL FIELD

The present disclosure relates to a deserializer, and more particularly, to a deserializer capable of preventing loss of data bits in an input data packet due to a phase difference between a data packet input from the outside and a clock signal for reconstructing the data packet.

BACKGROUND ART

Methods of data communication among electronic circuit systems may be classified as parallel communication methods and serial communication methods. A parallel communication method is a communication method in which data bits are transmitted/received in units of bytes. A serial communication method is a communication method in which data bits are transmitted/received in units of bits.

Recently, as techniques in such fields of memories, image sensors, etc. have developed, an amount of serial data received from an external interface has increased, and thus, a serial clock speed also increases. However, when a clock speed of a high-speed serial data receiver increases, power consumption also increases in proportional to the clock speed. However, the high-speed serial data receiver may not operate effectively due to heat generated according to the increase in the power consumption.

Here, a technical contradiction may occur, that is, the clock speed of a high-speed serial clock has to be lowered in order to address the above problem, but fast clock speed is still necessary in order to transmit the serial data fast.

DETAILED DESCRIPTION OF THE INVENTIVE CONCEPT

Technical Problem

One or more embodiments of the present disclosure relate to parallelizing of received high-speed serial clock and serial data packets and synchronizing and compensating for errors between a parallel clock and parallel data packets in order to prevent problems such as power consumption and heat generation, etc. due to the high-speed clock.

Technical Solution

According to an embodiment of the present disclosure, there is provided a high-speed serial data receiving apparatus including: a clock converter configured to convert a serial clock into a parallel clock; a data converter configured to convert a serial data packet into N parallel data packets and outputting the N parallel data packets; a synchronization signal detector configured to receive the N parallel data packets and the parallel clock, and detecting a data start synchronization of the N parallel data packets output from the data converter by comparing the parallel data packets with a synchronization code of N bits set in advance; and an error compensation unit configured to detect and compensate for a skew between parallel clock and data.

Advantageous Effects

According to the present disclosure, a high-speed serial data receiving apparatus parallelizes each of a high-speed serial clock and a serial data packet which are received, and synchronizes and compensates for an error between a parallel clock and parallel data packets to prevent problems such as power consumption, generation of heat, etc. due to the high-speed clock.

BEST MODE

According to an embodiment of the present disclosure, a high-speed serial data receiving apparatus includes: a clock converter configured to convert a serial clock into a parallel clock; a data converter configured to convert a serial data packet into N parallel data packets and outputting the N parallel data packets; a synchronization signal detector configured to receive the N parallel data packets and the parallel clock, and detecting a data start synchronization of the N parallel data packets output from the data converter by comparing the parallel data packets with a synchronization code of N bits set in advance; and an error compensation unit configured to detect and compensate for a skew between parallel clock and data.

MODE OF THE INVENTION

Hereinafter, one or more embodiments of the present disclosure will be described in detail with reference to accompanying drawings. The following description and the attached drawings are provided for better understanding of the disclosure, and descriptions of techniques or structures related to the present disclosure which would be obvious to one of ordinary skill in the art will be omitted.

The specification and drawings should be considered in a descriptive sense only and not for purposes of limitation. Therefore, the scope of the present disclosure is defined by the appended claims. The terms and words which are used in the present specification and the appended claims should not be construed as being confined to common meanings or dictionary meanings but should be construed as meanings and concepts matching the technical spirit of the present disclosure in order to describe the present disclosure in the best fashion.

Figure 1:
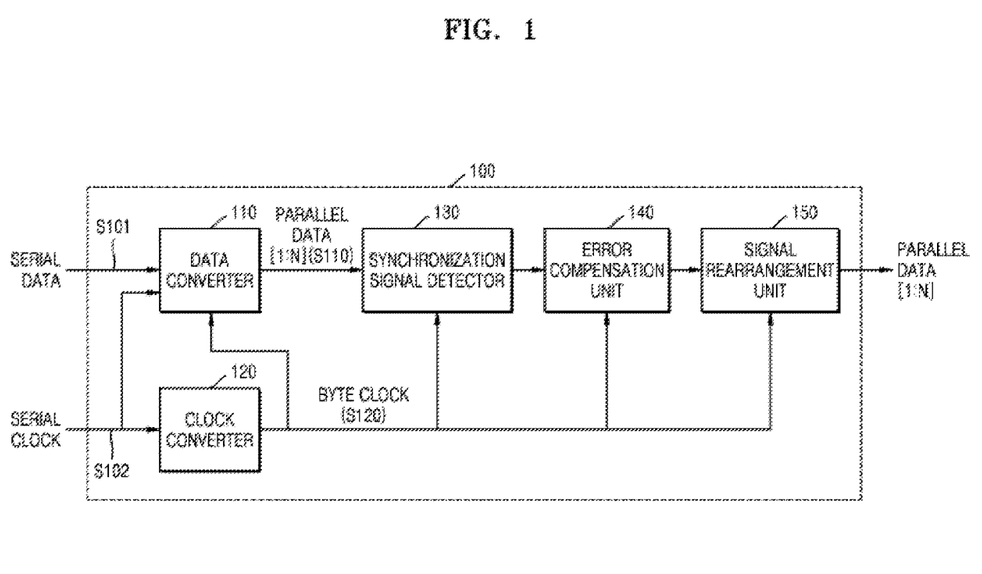
FIG. 1 is a diagram of an internal configuration of a high-speed serial data receiving apparatus, according to an embodiment of the present disclosure.

FIG. 1 is a diagram of an internal configuration of a high-speed serial data receiving apparatus, according to an embodiment of the present disclosure.

A high-speed serial data receiving apparatus 100 converts high-speed serial communication data into parallel data, and may be used in various serial interfaces including a sensor, a memory, a high-speed external interface, etc. The high-speed serial data receiving apparatus 100 converts a serial data packet into N parallel data packets and converts a serial clock to a parallel clock, and then, detects synchronization among the parallel data packets and compensates for an error detected while detecting the sync, and outputs the parallel data packets in synchronism with the parallel clock.

The high-speed serial data receiving apparatus 100 includes a data converter 110, a clock converter 120, a synchronization signal detector 130, an error compensation unit 140, and a signal rearrangement unit 150.

The data converter 110 receives a serial clock S102 and a serial data packet S101, and converts the serial data S101 into N parallel data packets S110 and outputs the parallel data packets S110.

Figure 3:
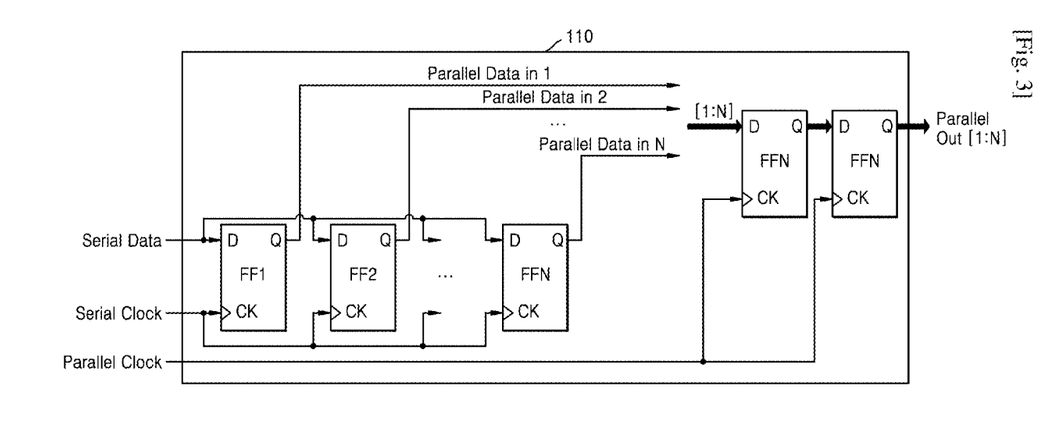
FIG. 3 is a diagram showing an example of an output of a parallel data packet when a DDR or SDR deserializer is used in a data converter, according to an embodiment of the present disclosure.
Figure 4:
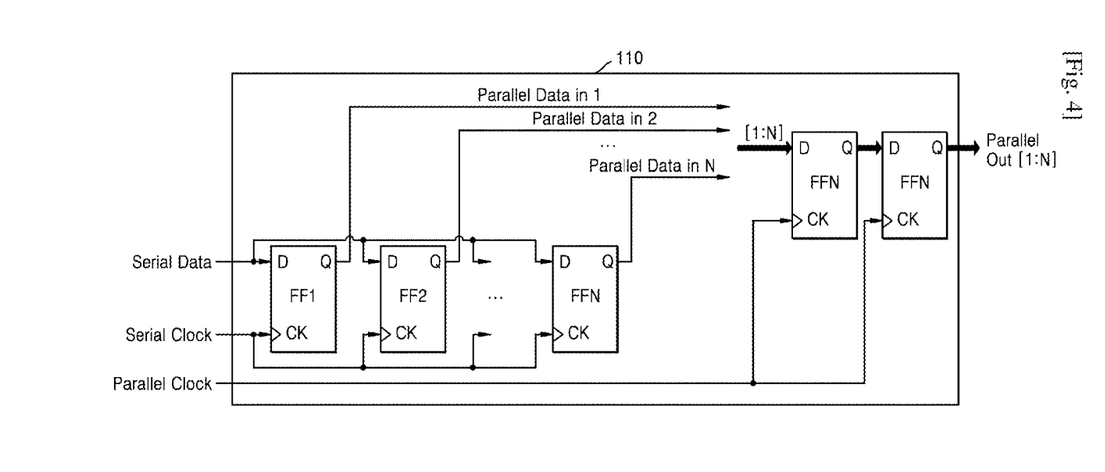
FIG. 4 is a diagram of an internal configuration of an SDR deserializer used in a data converter, according to an embodiment of the present disclosure.
Figure 5:
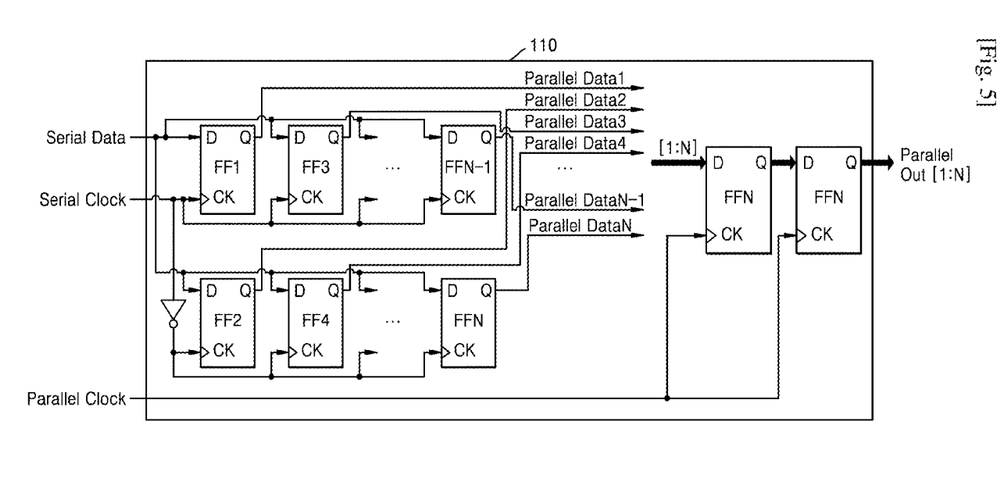
FIG. 5 is a diagram of an internal configuration of a DDR deserializer used in a data converter, according to an embodiment of the present disclosure.

As an embodiment of the present disclosure, the data converter 110 may convert the serial data packet S101 into N parallel data packets (S350, see FIG. 3) as shown in FIG. 3 by using a deserializer of a single data rate (SDR) type as shown in FIG. 4 or a deserializer of a double data rate (DDR) type as shown in FIG. 5. This will be described in detail with reference to FIGS. 4 and 5.

The clock converter 120 receives the serial clock S102 and operates to convert the serial clock S102 into a parallel clock S120. As an example, the clock converter 120 receiving the serial clock S102 outputs a parallel clock S120 that is slower by 1/N in a case where a signaling technique is SDR and slower by 2/N in a case where the signaling technique is DDR and N is parallelized width. The internal configuration of the clock converter 120 is shown in FIG. 2.

Figure 6:
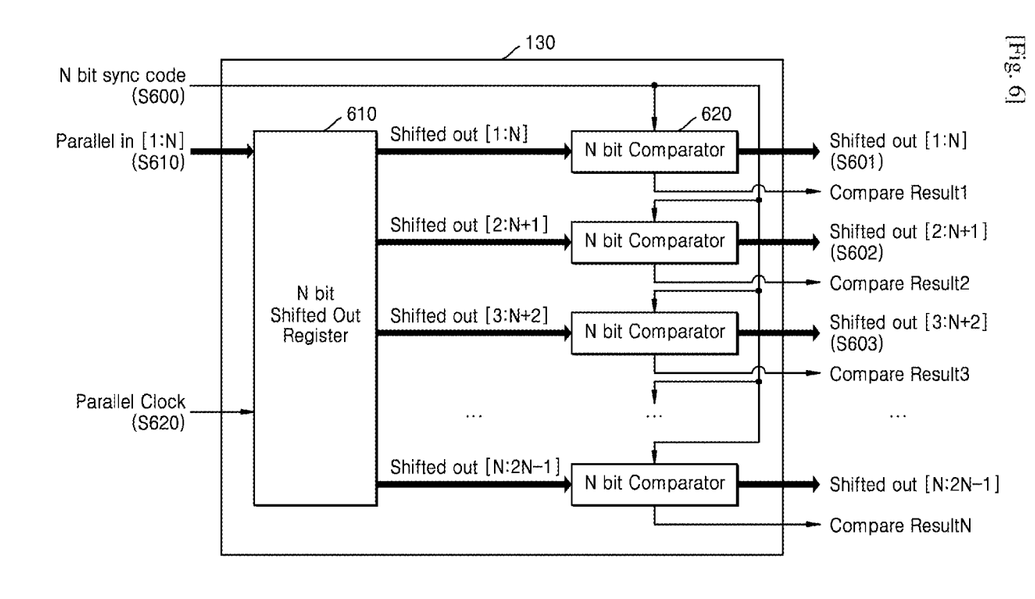
FIG. 6 is a diagram of an example of detecting synchronization in a synchronization signal detector, according to an embodiment of the present disclosure.

Since the synchronization is not detected from N parallel data packets S110 output from the data converter 110, it is difficult to find a bit where the data starts, from among one to N bits. To address this, the synchronization signal detector 130 receives the N parallel data packets S110 output from the data converter 110 and the parallel clock S120 output from the clock converter 120 and determines whether they match a synchronization code set in advance, and detects a synchronization signal based on the parallel data packet that matches the synchronization code. Internal configuration of the synchronization signal detector 130 is shown in FIG. 6.

Figure 2:
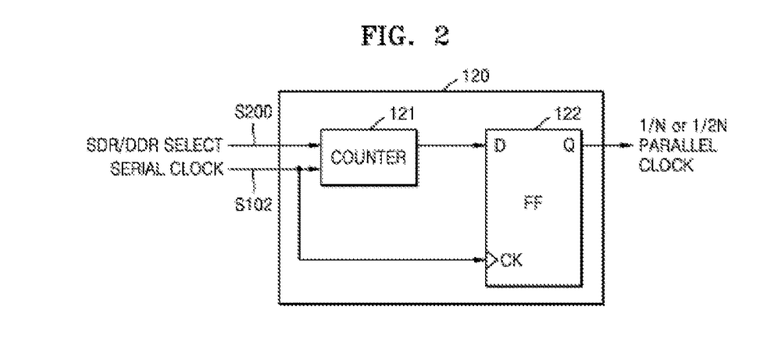
FIG. 2 is a diagram of an internal configuration of a clock converter according to an embodiment of the present disclosure.

FIG. 2 is a diagram of an internal configuration of a clock converter according to an embodiment of the present disclosure. The clock converter 200 includes a counter 121 and a flip-flop 122. The counter 121 receives a selected signal value S200 that is a value of one selected from the SDR and DDR and a serial clock S102 as input values. The flip-flop 122 receives an output value from the counter 121 and the serial clock as input values, and outputs a parallel clock. The counter 121 outputs parallel clocks by reversing values of the flip-flop 122 at every 2/N or 4/N count value, according to the SDR or DDR signal value.

FIG. 3 is a diagram showing an example of an output of a parallel data packet when a DDR or SDR deserializer is used in a data converter, according to an embodiment of the present disclosure. The data converter 110 receives serial data S320 or S340 input, and the serial clock S310 or S330 and the parallel clock, and outputs N pieces of parallel data S350.

If the data converter 110 (see FIG. 1) uses the SDR deserializer as shown in FIG. 4, the serial data S340 is sampled at every rising edge S331 of the serial clock S330 and stored in a register as much as N bits, and then, parallel data synchronized with the parallel clock is output according to a rising edge of the parallel clock.

FIG. 5 is a diagram of an internal configuration of a DDR deserializer used in a data converter, according to an embodiment of the present disclosure.

If the data converter 110 (see FIG. 1) uses the DDR type deserializer 500, the serial data is sampled at every rising edge and every falling edge of the serial clock and stored in the register as much as N bits, and then, the parallel data synchronized with the parallel clock is output according to the rising edge of the parallel clock.

FIG. 6 is a diagram of an example of detecting synchronization in a synchronization signal detector, according to an embodiment of the present disclosure.

The synchronization signal detector 130 includes an N-bit shifted out register 610 and N comparators 620. The synchronization signal detector 130 shifts the parallel data packet by one bit sequentially to maximum N bit by using the N-bit shifted out register 610, and determines whether each of the parallel data packets S601, S602, and S603 shifted from first bit to N-th bit matches the synchronization code S600 that is set in advance to detect a synchronization signal based on the parallel data packet that matches the synchronization code S600.

Figure 7:
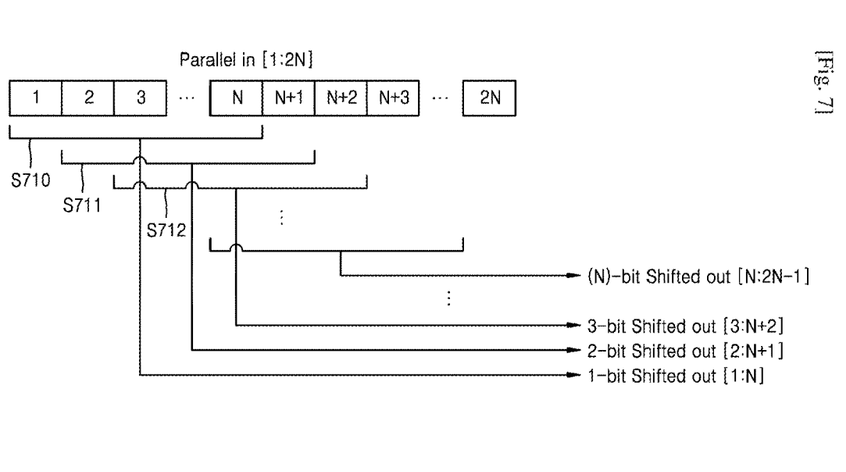
FIG. 7 is a diagram showing an example of comparing a synchronization code with a parallel data packet in a synchronization signal detector, according to an embodiment of the present disclosure.

The parallel data packets input into the synchronization signal detector 130 is converted into N outputs as shown in FIG. 7 via the N-bit shifted out register 610 (S710, S711, and S712). The synchronization signal detector 130 shifts the parallel data packets by one bit sequentially from 0 to (N-1)-th bit, that is, maximum N bits, by using the N-bit shifted out register 610, and then, compares each of the outputs with the synchronization code that is set in advance.

Figure 8:
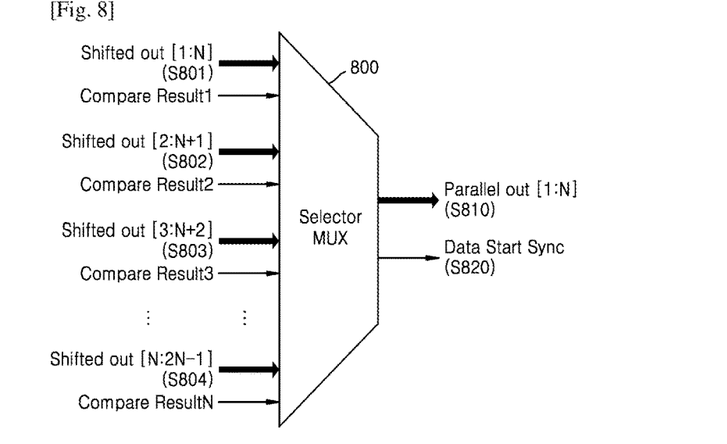
FIG. 8 is a diagram of an example of compensating for an error in an error compensation unit, according to an embodiment of the present disclosure.

As an embodiment, the comparator connected to a shifted out [2:N+1] output (S602) of FIGS. 6 and 7 will display a comparison result as True. An error compensation unit 800 receives N comparison values S801, S802, S803, and S804 output from the comparator of the synchronization signal detector 130 (see FIG. 6), as shown in FIG. 8. After that, from among N comparison results 1, 2, . . . , N (S801, S802, S803, and S804) output from the comparator, the shift-out representing the value (TRUE) matching the synchronization code that is set in advance is only output by a multiplexer 810. In this case, since the output shift-out is a signal having a skew that has been corrected, the error compensation unit outputs the shift-out as a parallel data packet S810 having the skew that has been corrected.

Figure 9:
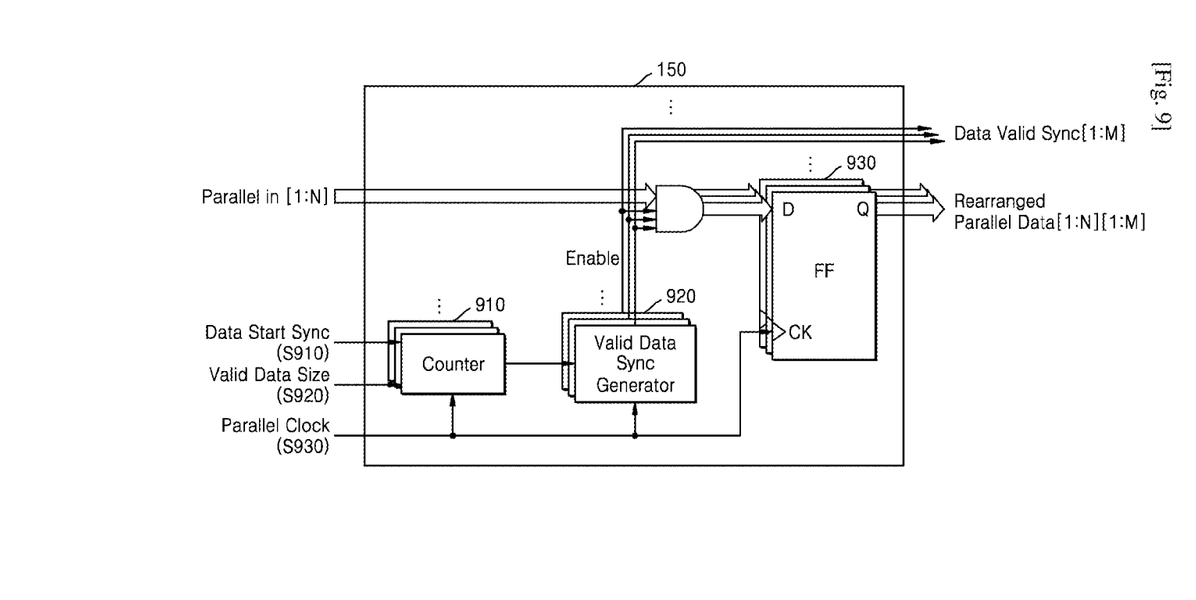
FIG. 9 is a diagram showing an internal configuration of a signal rearrangement unit, according to an embodiment of the present disclosure.

FIG. 9 is a diagram showing an internal configuration of a signal rearrangement unit, according to an embodiment of the present disclosure. The signal rearrangement unit 150 receive the parallel data packet output value that has been synchronized and has the corrected skew from the error compensation unit 800 (see FIG. 8), and outputs the data as a user wants.

The signal rearrangement unit 150 receives a desired size of data from the user or sets a desired size of data by a manager, and transfers information about the data size to a counter 910. The counter 910 counts the number of pieces of data from the start of the data start synchronization for every parallel clock S930, and when the count reaches the value set by the user, the counter 910 transfers counting result to a valid data synchronization generator 920. The valid data synchronization generator 920 generates a valid data section in Parallel Data In as a synchronization signal based on the above result.

The signal rearrangement unit 150 applies an enable signal and a Parallel In to an AND gate as inputs so that the parallel data packets are input only when the synchronization signal is True, and outputs via the flip-flop 930. One or more synchronization signals or one or more parallel data outputs may be used.

While this disclosure has been particularly shown and described with reference to preferred embodiments thereof, it will be understood by those skilled in the art that various changes in form and details may be made therein without departing from the spirit and scope of the disclosure as defined by the appended claims.

The preferred embodiments should be considered in descriptive sense only and not for purposes of limitation. Therefore, the scope of the disclosure is defined not by the detailed description of the disclosure but by the appended claims, and all differences within the scope will be construed as being included in the disclosure.

The invention claimed is:

1. A high-speed serial data receiving apparatus comprising:
   a clock converter configured to convert a serial clock into a parallel clock;
   a data converter configured to convert a serial data packet into N parallel data packets and output the N parallel data packets;
   a synchronization signal detector configured to receive the N parallel data packets and the parallel clock, and detect data start synchronization of the N parallel data packets output from the data converter by comparing the parallel data packets with a synchronization code of preset N bits; and
   an error compensation unit configured to detect a clock skew between parallel clocks and compensate for the clock skew.

2. The high-speed serial data receiving apparatus of claim 1, wherein the data converter converts the serial data packet into N parallel data packets by sampling the serial data packet into N flip-flops based on the serial clock.

3. The high-speed serial data receiving apparatus of claim 2, wherein the data converter outputs the N parallel data packets by synchronizing the N parallel data packets by using the parallel clock.

4. The high-speed serial data receiving apparatus of claim 1, wherein the clock converter comprises:
   a counter configured to receive a selection signal value that is selected between a single data rate (SDR) and a double data rate (DDR), and the serial clock, as input values; and
   a flip-flop configured to receive an output value of the counter and the serial clock, as input values, and output the parallel clock.

5. The high-speed serial data receiving apparatus of claim 1, wherein the clock converter outputs a parallel clock that is slower by 1/N than the serial clock, when the data converter is a deserializer of an SDR type.

6. The high-speed serial data receiving apparatus of claim 1, wherein the clock converter outputs a parallel clock that is slower by 2/N than the serial clock, when the data converter is a deserializer of a DDR type.

7. The high-speed serial data receiving apparatus of claim 1, wherein, when the data converter is a deserializer of an SDR type, the serial data packet is sampled as N flip-flops at every rising edge of the serial clock to generate a parallel data packet of N bits, and is sampled at every falling edge of the parallel clock input in order to output a parallel data packet that is synchronized with the parallel clock.

8. The high-speed serial data receiving apparatus of claim 1, wherein, when the data converter is a deserializer of a DDR type, the serial data packet is sampled as N flip-flops at a rising edge and a falling edge of the serial clock to generate a parallel data packet of N bits, and is sampled at a rising edge of the parallel clock input in order to output a parallel data packet that is synchronized with the parallel clock.

9. The high-speed serial data receiving apparatus of claim 1, wherein the synchronization signal detector shifts the parallel data packet by one bit sequentially to a maximum N-th bit by using an N bit shifted out register, determines whether each parallel data packet shifted from a first bit to the N-th bit matches a synchronization code that is set in advance, and detects a data start synchronization signal based on a parallel data packet that matches the synchronization code.

10. The high-speed serial data receiving apparatus of claim 9, wherein the error compensation unit detects an amount of shifted bits of the parallel data packet matching the synchronization code as a clock skew based on the parallel data packet corresponding to the synchronization code, and compensates for the clock skew.

11. The high-speed serial data receiving apparatus of claim 9, wherein the error compensation unit detects and outputs the parallel data packet matching the synchronization code that is set in advance by using a multiplexer.

12. A method of converting data into parallel data in a high-speed serial data receiving apparatus, the method comprising:
    converting a serial clock into a parallel clock in a clock converter;
    converting a serial data packet into N parallel data packets and outputting the N parallel data packets by a data converter;
    detecting, by a synchronization signal detector, a synchronization of the N parallel data packets output from the data converter based on comparison between the N parallel data packets and a synchronization code of preset N bits; and
    detecting and compensating for a clock skew between parallel clocks by an error compensation unit.

13. The method of claim 12, wherein the clock converter outputs a parallel clock that is slower by 1/N than the serial clock, when the data converter is a deserializer of a single data rate (SDR) type.

14. The method of claim 12, wherein the clock converter outputs a parallel clock that is slower by 2/N than the serial clock, when the data converter is a deserializer of a double data rate (DDR) type.

15. The method of claim 12, wherein, when the data converter is a deserializer of an SDR type, the serial data packet is sampled as N flip-flops at every rising edge of the serial clock to generate a parallel data packet of N bits, and is sampled at every falling edge of the parallel clock input in order to output a parallel data packet that is synchronized with the parallel clock.

16. The method of claim 12, wherein, when the data converter is a deserializer of a DDR type, the serial data packet is sampled as N flip-flops at a rising edge and a falling edge of the serial clock to generate a parallel data packet of N bits, and is sampled at a rising edge of the parallel clock input in order to output a parallel data packet that is synchronized with the parallel clock.

\* \* \* \* \*